United States Patent
Gohira et al.

(10) Patent No.: US 11,804,379 B2
(45) Date of Patent: Oct. 31, 2023

(54) ETCHING METHOD AND PLASMA PROCESSING APPARATUS

(71) Applicant: Tokyo Electron Limited, Tokyo (JP)

(72) Inventors: Taku Gohira, Miyagi (JP); Michiko Nakaya, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/405,305

(22) Filed: Aug. 18, 2021

(65) Prior Publication Data

US 2022/0059360 A1 Feb. 24, 2022

(30) Foreign Application Priority Data

Aug. 19, 2020 (JP) .................. 2020-138923

(51) Int. Cl.
*H01L 21/311* (2006.01)
*H01L 21/3213* (2006.01)
*H01J 37/32* (2006.01)
*H01L 21/02* (2006.01)

(52) U.S. Cl.
CPC .. *H01L 21/31116* (2013.01); *H01J 37/32724* (2013.01); *H01L 21/31144* (2013.01); *H01L 21/32137* (2013.01); *H01L 21/0217* (2013.01); *H01L 21/02164* (2013.01)

(58) Field of Classification Search
None
See application file for complete search history.

(56) References Cited

U.S. PATENT DOCUMENTS

2015/0235862 A1* 8/2015 Takahashi ......... H01L 21/32135
  438/714
2017/0365487 A1* 12/2017 Shen ................. H01L 21/31144
2019/0131135 A1* 5/2019 Belau ................ H01L 21/308

FOREIGN PATENT DOCUMENTS

JP 2016-207840 A 12/2016

* cited by examiner

*Primary Examiner* — Roberts P Culbert
(74) *Attorney, Agent, or Firm* — Pearne & Gordon LLP

(57) ABSTRACT

An etching method of forming, on a substrate having a base film; a stacked film in which a first film and a second film are alternately stacked on the base film; and a mask on the stacked film, a recess in the stacked film through the mask by using plasma includes preparing the substrate; and etching the stacked film until the recess of the stacked film reaches the base film by plasma formed from a gas containing hydrogen, fluorine and carbon, while maintaining a substrate temperature equal to or less than 15° C.

20 Claims, 9 Drawing Sheets

FIG. 2
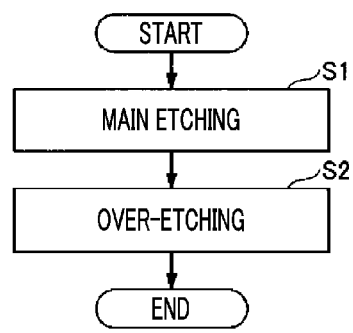
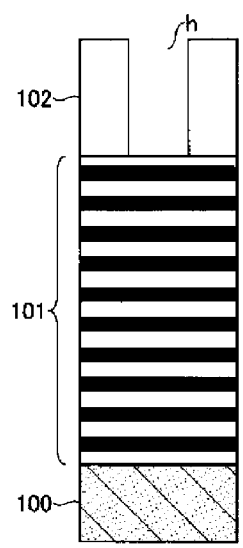
FIG. 3A
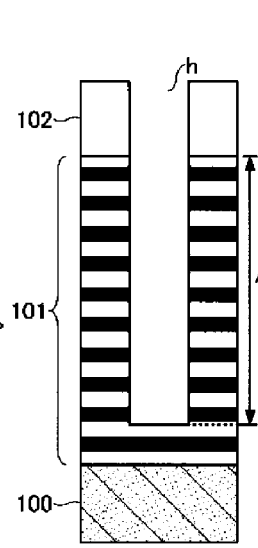
FIG. 3B
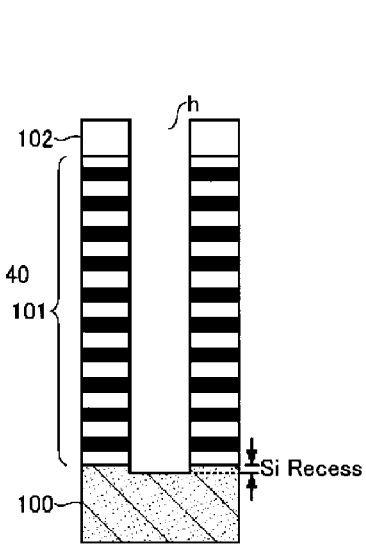
FIG. 3C

L.M. Ephrath, J. Electrochem. Soc. 126, 1419 (1979)

FIG. 11

| GAS | NOT ADDED | SiCl₄ ADDED | Cl₂ ADDED | HBr ADDED |
|---|---|---|---|---|
| Bow CD | 90 | 91 | 90 | 92 |
| Btm CD | 39 | 51 | 52 | 53 |
| Δ(Bow CD −Btm CD) | 51 | 40 | 38 | 39 |

ETCHING METHOD AND PLASMA PROCESSING APPARATUS

CROSS-REFERENCE TO RELATED APPLICATION

This application claims the benefit of Japanese Patent Application No. 2020-138923 filed on Aug. 19, 2020, the entire disclosure of which is incorporated herein by reference.

TECHNICAL FIELD

The various aspects and embodiments described herein pertain generally to an etching method and a plasma processing apparatus.

BACKGROUND

Patent Document 1, for example, proposes etching a stacked film including a silicon oxide film and a silicon nitride film by plasma formed in a low-temperature environment equal to or less than −30° C.

Patent Document 1: Japanese Patent Laid-open Publication No. 2016-207840

SUMMARY

In one exemplary embodiment, there is provided an etching method of forming, on a substrate having a base film; a stacked film in which a first film and a second film are alternately stacked on the base film; and a mask on the stacked film, a recess in the stacked film through the mask by using plasma. The etching method includes preparing the substrate; and etching the stacked film until the recess of the stacked film reaches the base film by plasma formed from a gas containing hydrogen, fluorine and carbon, while maintaining a substrate temperature equal to or less than 15° C.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a diagram illustrating an example of an etching method according to the exemplary embodiment;

FIG. 3A to FIG. 3C are diagrams illustrating an example of a film structure as an etching target according to the exemplary embodiment;

FIG. 11 is a diagram illustrating examples of the bottom CD when various kinds of gases are added to the gas used in the etching method according to the exemplary embodiment.

DETAILED DESCRIPTION

Figure 1:
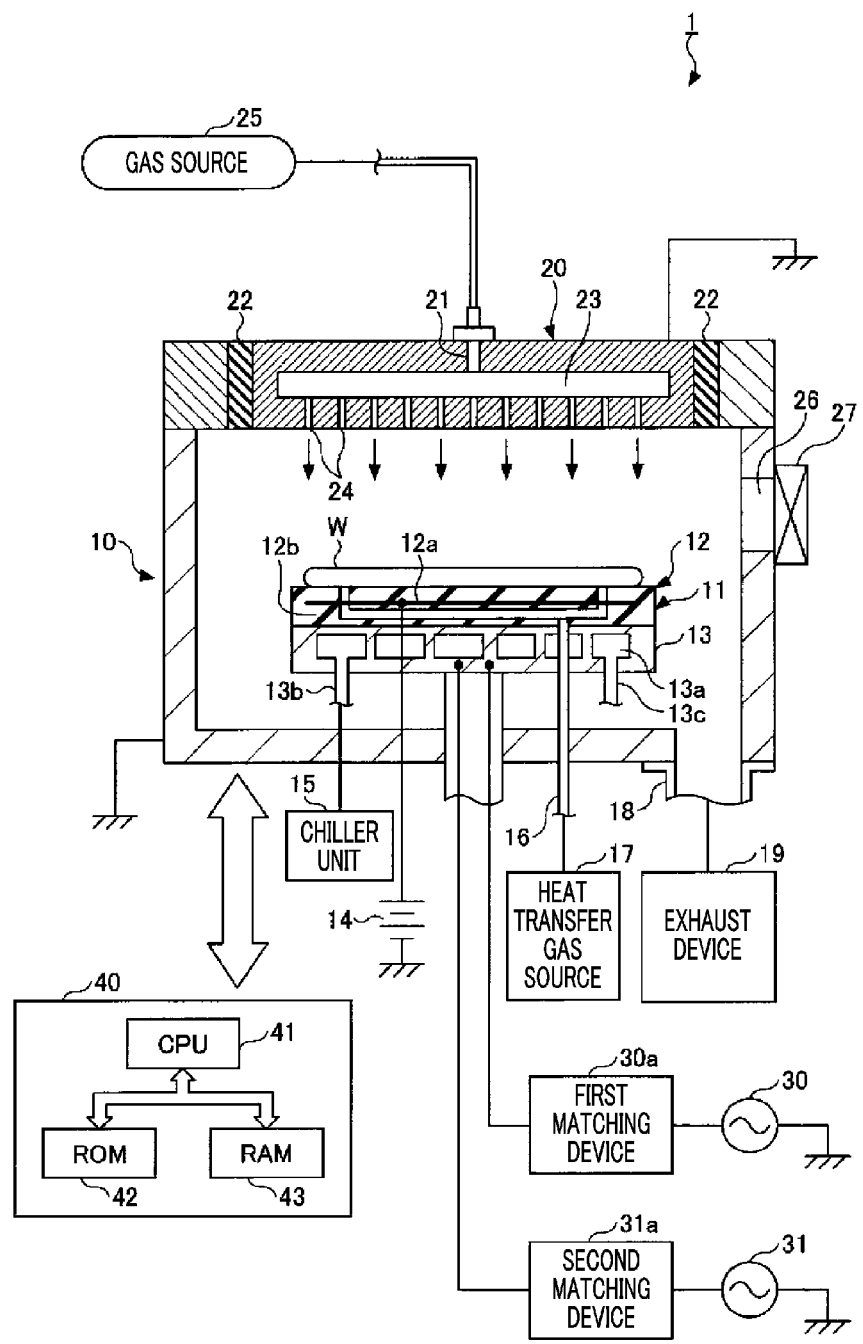
FIG. 1 is a schematic cross sectional view illustrating an example of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiment of the present disclosure will be described with reference to the accompanying drawings. In the various drawings, same parts will be assigned same reference numerals, and redundant description thereof may be omitted.

[Plasma Processing Apparatus]

A plasma processing apparatus 1 according to an exemplary embodiment will be described with reference to FIG. 1. FIG. 1 is a schematic cross sectional view illustrating an example of the plasma processing apparatus 1 according to the exemplary embodiment. The plasma processing apparatus 1 according to the exemplary embodiment is a parallel plate type plasma processing apparatus in which a placing table 11 and a shower head 20 are disposed to face each other within a processing vessel 10.

The placing table 11 has a function to hold a substrate W, for example, a wafer, and also serves as a lower electrode. The shower head 20 has a function to supply a gas into the processing vessel 10 in a shower shape, and also serves as an upper electrode.

The processing vessel 10 is made of, for example, aluminum having an alumite-treated (anodically oxidized) surface, and has a cylindrical shape. The processing vessel 10 is electrically grounded. The placing table 11 is disposed at a bottom of the processing vessel 10 to place the substrate W thereon.

The placing table 11 is formed of, for example, aluminum (Al), titanium (Ti), silicon carbide (SiC), or the like. The placing table 11 has an electrostatic chuck 12 and a base 13. The electrostatic chuck 12 is provided on the base 13. The electrostatic chuck 12 has a structure in which a chuck electrode 12a is embedded in an insulator 12b. The chuck electrode 12a is connected with a power supply 14. The electrostatic chuck 12 is configured to attract and hold the substrate W thereon by a Coulomb force generated by a voltage applied from the power supply 14 to the chuck electrode 12a.

The base 13 supports the electrostatic chuck 12. A coolant path 13a is formed within the base 13. The coolant path 13a is connected with a coolant inlet line 13b and a coolant outlet line 13c. A cooling medium (temperature control medium) of a preset temperature is outputted from a chiller unit 15, and this cooling medium circulates through the coolant inlet line 13b, the coolant path 13a and the coolant outlet line 13c. Accordingly, the placing table 11 is cooled (temperature-adjusted), so that the substrate W is regulated to a predetermined temperature.

A heat transfer gas source 17 is configured to supply a heat transfer gas such as a helium gas into a gap between a front surface of the electrostatic chuck 12 and a rear surface of the substrate W through a gas supply line 16. Accordingly, heat transfer efficiency between the electrostatic chuck 12 and the substrate W is enhanced, so that temperature controllability of the substrate W can be improved.

The placing table 11 is electrically connected, via a first matching device 30a, with a first high frequency power supply 30 which is configured to supply a first high frequency power (HF power) for plasma excitation having a first frequency. Further, the placing table 11 is also electrically connected with, via a second matching device 31a, a second high frequency power supply 31 which is configured to supply a second high frequency power (LF power) for bias voltage having a second frequency lower than the first frequency. The first high frequency power supply 30 applies the first high frequency power of, e.g., 40 MHz to the placing table 11. The second high frequency power supply 31 applies the second high frequency power of, e.g., 400 kHz to the placing table 11. Further, the first high frequency power supply 30 may apply the first high frequency power to the shower head 20.

The first matching device 30a is configured to match a load impedance at the placing table 11 side with an output (internal) impedance of the first high frequency power supply 30. The second matching device 31a is configured to match the load impedance at the placing table 11 side with an output (internal) impedance of the second high frequency power supply 31.

The shower head 20 closes an opening at a ceiling of the processing vessel 10 with an insulating shield ring 22 therebetween. The insulating shield ring 22 covers a circumference of the shower head 20. The shower head 20 is provided with a gas inlet port 21 through which a gas is introduced. The shower head 20 has therein a diffusion space 23 connected with the gas inlet port 21. A gas outputted from a gas source 25 is supplied into the diffusion space 23 through the gas inlet port 21, and then introduced into the processing vessel 10 through a multiple number of gas supply holes 24.

A gas exhaust port 18 is formed in a bottom surface of the processing vessel 10, and a gas exhaust device 19 is connected to the gas exhaust port 18. The gas exhaust device 19 evacuates the processing vessel 10, and, accordingly, the inside of the processing vessel 10 is regulated to a preset vacuum degree. A gate valve 27 for opening/closing a transfer opening 26 is provided at a sidewall of the processing vessel 10. As the gate valve 27 is opened or closed, the substrate W is carried into or out of the processing vessel 10 through the transfer opening 26.

The plasma processing apparatus 1 is equipped with a controller 40 configured to control an overall operation of the apparatus. The controller 40 includes a CPU 41, a ROM 42, and a RAM 43. The CPU 41 performs an etching process upon the substrate W according to various kinds of recipes stored in memory areas of the ROM 42 and the RAM 43. The recipes include, as control information of the apparatus upon processing conditions, a processing time, a pressure (gas exhaust), high frequency powers and voltages, flow rates of various kinds of gases, a substrate temperature (a temperature of the electrostatic chuck 12, etc.), a temperature of the cooling medium supplied from the chiller unit 15, and so forth. Further, programs and the recipes including the processing conditions may be stored in a hard disk or a semiconductor memory. Further, the recipes may be set to a preset position in the memory area while being recorded on a computer-readable portable recording medium such as a CD-ROM or a DVD.

To perform a substrate processing, opening/closing of the gate valve 27 is controlled, and the substrate W held by a transfer arm is carried into the processing vessel 10 through the transfer opening 26, placed on the placing table 11, and attracted to the electrostatic chuck 12.

Then, the gas is supplied from the shower head 20 into the processing vessel 10, and the first high frequency power is applied to the placing table 11 to form plasma. An etching processing is performed on the substrate W by the formed plasma. The second high frequency power as well as the first high frequency power may be applied to the placing table 11.

Upon the completion of the etching processing, electric charges of the substrate W are neutralized through a charge neutralization processing, and the substrate W is spaced apart from the electrostatic chuck 12 to be carried out of the processing vessel 10.

The substrate temperature (for example, the temperature of the wafer) is adjusted as the temperature of the electrostatic chuck 12 regulated to a preset temperature by the chiller unit 15 is transferred to the substrate W via the front surface of the electrostatic chuck 12 and the heat transfer gas. However, the substrate W is exposed to the plasma formed by the first high frequency power for plasma excitation, and light from the plasma and ions attracted by the second high frequency power for bias voltage are radiated to the substrate W. For the reason, the temperature of the substrate W, that is, a temperature of a front surface of the substrate W in contact with the plasma becomes higher than the adjusted temperature of the electrostatic chuck 12. Further, since the substrate temperature may be increased by radiant heat from the temperature-adjusted facing electrode or the sidewall of the processing vessel 10 as well, an actual temperature of the substrate W during the etching processing may be measured. If a temperature difference between the adjusted temperature of the electrostatic chuck 12 and the actual front surface temperature of the substrate W can be estimated from the processing conditions, a setting for the adjusted temperature of the electrostatic chuck 12 may be lowered to adjust the temperature of the substrate W within a preset temperature range.

[Etching Method]

In an etching method according to the exemplary embodiment, while maintaining the substrate temperature equal to or less than 15° C., an etching target film is etched. Performing the etching while maintaining the substrate temperature equal to or less than 15° C. is referred to as "low-temperature etching." Further, in the following description, the substrate temperature refers to "the front surface temperature of the substrate W."

The etching method according to the present exemplary embodiment will be discussed with reference to FIG. 2 to FIG. 3C. FIG. 2 is a diagram illustrating an example of the etching method according to the exemplary embodiment. FIG. 3A to FIG. 3C are diagrams illustrating an example of a film structure as an etching target according to the exemplary embodiment.

As depicted in FIG. 2, in the etching method according to the exemplary embodiment, the etching target film is etched to a preset depth by the plasma formed by the plasma processing apparatus 1 (process S1). The etching of the process S1 is also referred to as "main etching". Then, the etching target film is further etched by the plasma until a base film under the etching target film is exposed (process S2), and the present processing is ended. The etching of the process S2 is also referred to as "over-etching."

FIG. 3A illustrates an example of the film structure as the etching target. As depicted in FIG. 3A, the etching target film is a stacked film 101 in which silicon oxide films and silicon nitride films are alternately stacked on top of each other. The silicon oxide film is an example of a first film, and the silicon nitride film is an example of a second film.

A base film 100 is provided under the stacked film 101, and a mask 102 is provided on top of the stacked film 101. The base film 100 is formed of polysilicon. However, the base film 100 may be formed of amorphous silicon or single crystal silicon without being limited to the polysilicon. The mask 102 is an organic material and has a hole h. A recess is formed in the stacked film 101 through the hole h of the mask 102 by plasma of a gas supplied into the plasma processing apparatus 1. The recess formed in the stacked film 101 is not limited to a hole shape but may be of a line shape.

In the main etching of the process S1, as the stacked film 101 is etched, the recess is formed in the stacked film 101, as shown in FIG. 3B. The main etching is ended before the base film 100 is exposed. In the over-etching of the process S2, the stacked film 101 is further etched, as shown in FIG. 3C, and this over-etching is performed until the base film 100 is exposed.

The main etching is performed, before the over-etching, until the recess (for example, the hole h) of the stacked film 101 is given a preset depth. The preset depth of the recess may be equal to or larger than 40 in an aspect ratio.

In an example of a conventional main etching, the low-temperature etching is performed on the stacked film 101 by setting the substrate temperature to be equal to or less than, e.g., 0° C. In the low-temperature etching, an etching rate of the stacked film 101 is increased. Besides, in the main etching, selectivity against the mask 102 is also high.

If, however, the low-temperature etching is performed as the over-etching as well, selectivity against the base film 100 is not sufficient. After performing the low-temperature etching as the main etching until immediately before the base film 100 is exposed, the low-temperature etching is performed as the over-etching as well, and a variation of a recess amount of the base film 100 with a lapse of time is measured. As a result, in the low-temperature etching, the etching cannot be stopped even after the base film 100 is exposed, resulting in an increase of the recess amount of the base film 100.

Figure 4:
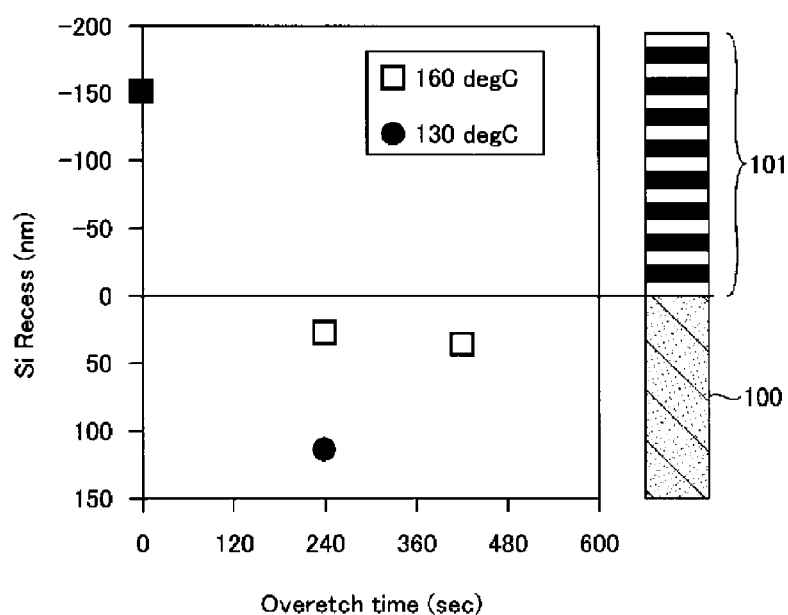
FIG. 4 is a diagram illustrating an example of a relationship between a substrate temperature and selectivity in a conventional over-etching.

In view of this, as another example of the conventional over-etching, the etching is performed after increasing the substrate temperature to, e.g., about 80° C. FIG. 4 is a diagram illustrating an example of a relationship between the substrate temperature and the selectivity in the conventional over-etching. Processing conditions for the over-etching for obtaining an experimental result shown in FIG. 4 are specified as follows.

<Processing Conditions for Conventional Over-Etching>
Gas kinds: $C_4F_6/C_4F_8/CH_2F_2/O_2$
Substrate temperature: 160° C., 130° C.

In FIG. 4, a horizontal axis represents an over-etching time, and a vertical axis represents a recess amount of polysilicon (Si) as the base film 100. The recess amount of the base film 100 indicates a depth of the recess of the base film 100 etched in the over-etching, as shown in FIG. 3C. If selectivity for the stacked film 101 against the base film 100 is sufficient, the recess amount of the base film 100 is small, which is desirable.

In the experimental result shown in FIG. 4, an etching rate of silicon of the base film 100 is found to be 2.7 nm/min when the substrate temperature is regulated to 160° C. When the substrate temperature is regulated to 130° C., on the other hand, the recess of the base film 100 at a time point of 240 seconds is degraded as compared to the case where the substrate temperature is regulated to 160° C., and the etching rate of the silicon of the base film 100 is found to be equal to or larger than 28 nm/min at least. That is, when the substrate temperature is controlled to 130° C., the selectivity against the base film 100 is lowered, resulting in the increase of the recess amount of the base film 100.

To achieve the sufficient selectivity against the base film 100 in the over-etching, the low-temperature etching has been performed as the main etching to obtain a high etching rate while achieving sufficient selectivity against the mask 102, and the over-etching has been performed by setting the substrate temperature to be equal to or higher than the temperature of the main etching to achieve the sufficient selectivity against the base film 100. In this etching method, however, the substrate temperature needs to be changed between the main etching and the over-etching. Resultantly, it takes time for the temperature control, resulting in reduction of a throughput. Alternatively, in addition to the plasma processing apparatus 1 configured to perform the main etching, a non-illustrated additional plasma processing apparatus 1' in which the substrate temperature is controlled to be equal to or higher than the temperature of the main etching to perform the over-etching may be prepared, and the substrate may be transferred to this plasma processing apparatus 1' after the main etching to be subjected to the over-etching therein. This method, however, also accompanies the reduction of the throughput.

In view of the foregoing problems, in the etching method according to the present exemplary embodiment to be described later, the low-temperature etching is performed in the main etching by setting the substrate temperature to be equal to or lower than 15° C., and the low-temperature etching is performed in the over-etching by controlling the substrate temperature to be equal to the substrate temperature in the main etching. At this time, processing conditions are optimized to achieve the sufficient selectivity against the base film 100 in the over-etching as well, and the sufficient selectivity and the high etching rate can be achieved in the over-etching as well.

[Processing Conditions]

Processing conditions for the over-etching according to the present exemplary embodiment are as follows.

<Processing Conditions for Over-Etching of Present Exemplary Embodiment>

Pressure within processing vessel: 0 mT (1.333 Pa)

Gases: $CH_2F_2/C_4F_8/O_2$

Substrate temperature: 15° C.

Figure 5A:
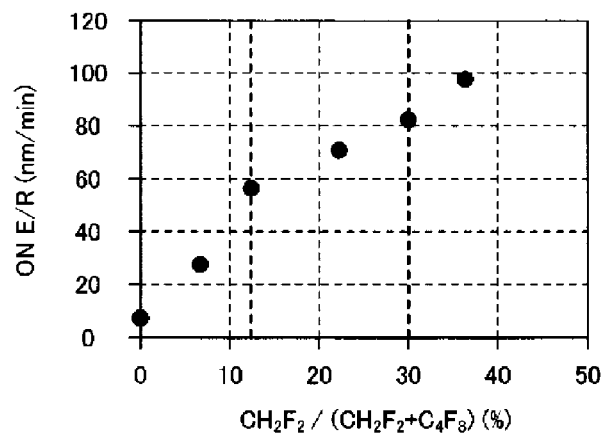
FIG. 5A to FIG. 5C are diagrams illustrating selectivity and others when using a $CH_2F_2$ gas in the etching method according to the exemplary embodiment.
Figure 5B:
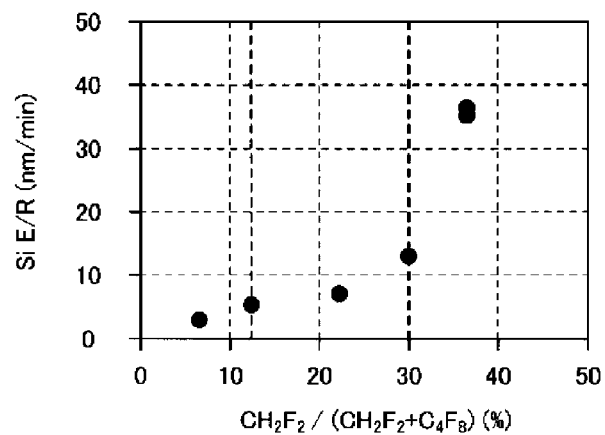
Figure 5C:
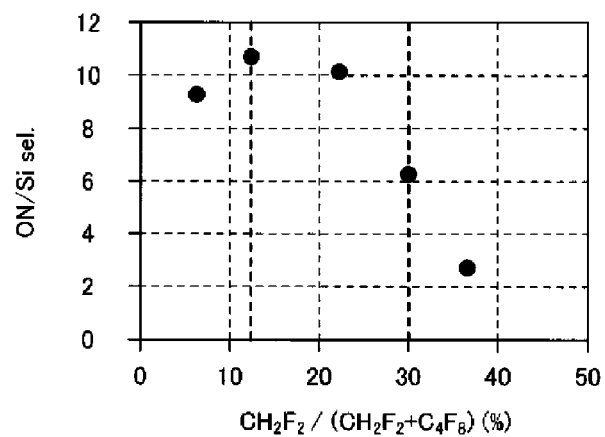

FIG. 5A to FIG. 5C are diagrams illustrating examples of an etching rate of the stacked film 101, an etching rate of the base film 100, and selectivity with respect to a ratio between a $CH_2F_2$ gas and a $C_4F_8$ gas in the etching method according to the exemplary embodiment, respectively. A horizontal axis in each of FIG. 5A to FIG. 5C represents the ratio of the $CH_2F_2$ gas to the sum of the $CH_2F_2$ gas and the $C_4F_8$ gas. A vertical axis of FIG. 5A indicates the etching rate E/R of the stacked film 101. In FIG. 5A to FIG. 5C and others, the stacked film 101 is represented by "ON." A vertical axis of FIG. 5B indicates the etching rate E/R of the base film 100 (Si). A vertical axis of FIG. 5C represents the selectivity Sel. for the stacked film 101 against the base film 100. In the etching of the stacked film 101 under the respective etching conditions, a ratio of an $O_2$ gas in each etching condition is adjusted such that the hole h of the mask 102 is not clogged, while a protective film is formed on the mask 102.

It is desirable that the etching rate of the stacked film 101 shown in FIG. 5A is high. From the experimental result of FIG. 5A, it is found out that the ratio of the $CH_2F_2$ gas needs to be equal to or larger than 12.5%, desirably.

It is desirable that the etching rate of the base film 100 shown in FIG. 5B is low. From the experimental result of FIG. 5B, it is found out that the ratio of the $CH_2F_2$ gas needs to be equal to or less than 30.0%, desirably. As can be seen from the results of FIG. 5A and FIG. 5B, it is desirable that the ratio of the $CH_2F_2$ gas is within a range from 12.5% to 30.0%.

As shown in FIG. 5C, if the ratio of the $CH_2F_2$ gas falls within the range from 12.5% to 30.0%, the high selectivity against the base film 100 is obtained. As can be seen from this experimental result, the high selectivity can be obtained in the over-etching if the ratio of the $CH_2F_2$ gas is in the range from 12.5% to 30.0%.

Now, a relationship between a ratio of H or F in the gases used in the etching method according to the exemplary embodiment and the etching rate or the selectivity will be explained with reference to FIG. 6A to FIG. 6D. FIG. 6A to FIG. 6D are diagrams illustrating an example of the relationship between the ratio of H or F in the gases used in the etching method according to the exemplary embodiment and the etching rate or the selectivity. This data are obtained by converting horizontal axes of graphs to a ratio of H or F in the gases from the experimental results of FIG. 5A to FIG. 5C.

Figure 6A:
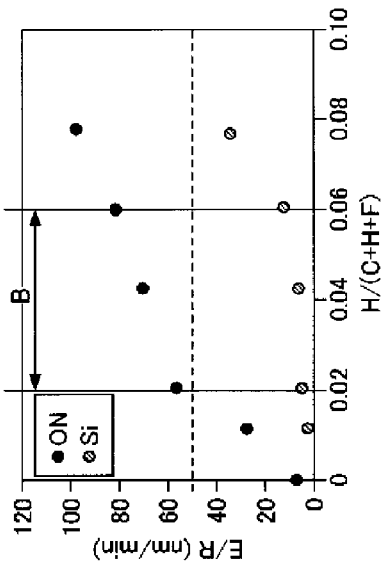
FIG. 6A to FIG. 6D are diagrams illustrating an example of a relationship between a ratio of H or F in a gas used in the etching method according to the exemplary embodiment and an etching rate or selectivity.
Figure 6C:
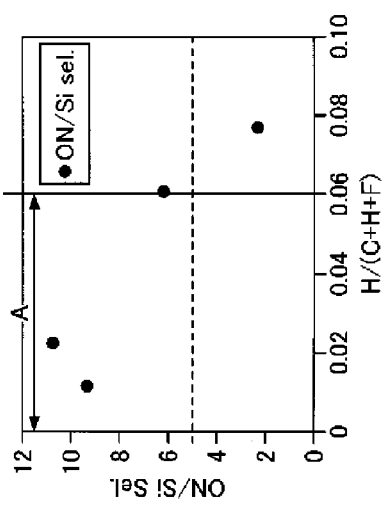
Figure 6B:
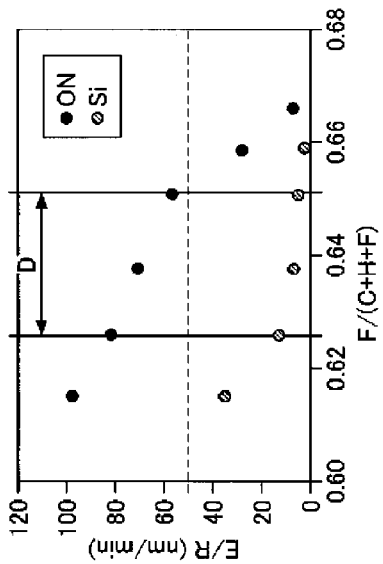
Figure 6D:
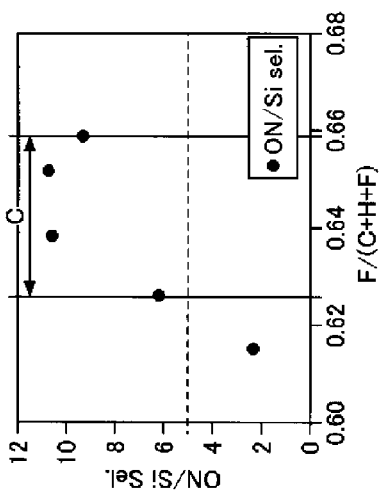

FIG. 6A shows a relationship between the selectivity and the ratio of hydrogen (H) to the sum of the hydrogen (H), fluorine (F) and carbon (C) included in the gases used in the over-etching, and FIG. 6B shows a relationship between the ratio of the H and the etching rate. Further, FIG. 6C shows a relationship between the selectivity and the ratio of the fluorine (F) to the sum of the hydrogen (H), the fluorine (F) and the carbon (C) included in the gases used in the over-etching, and FIG. 6D shows a relationship between the ratio of the F and the etching rate.

An amount of an element of each of the hydrogen (H), fluorine (F) and the carbon (C) is calculated, from structural formulas of the gases used in the over-etching, as the sum of the product of a volumetric flow rate of the gas and a valence number of the element included in the gas.

A horizontal axis in each of FIG. 6A and FIG. 6B represents the ratio of the H to the sum of the H, F and C included in the gases. A vertical axis of FIG. 6A indicates the selectivity of the stacked film 101 (ON) against the base film 100 (Si). A vertical axis of FIG. 6B indicates the etching rates of the stacked film 101 (ON) and the base film 100 (Si).

The ratio of the H to the sum of the H, F and C is desirably set to be in a range allowing the selectivity to be equal to or larger than 5 indicated by a dashed line in FIG. 6A and the etching rate of the stacked film ON to be equal to or larger than 50 nm/min indicated by a dashed line in FIG. 6B. Further, in FIG. 6B, it is desirable that the etching rate of the base film 100 is less than 20 nm/min. It is found out from the result of FIG. 6A that the ratio of the H to the sum of the H, F and C needs to be in a range A from 0 to 0.06 (0% to 6%) to meet the condition that the selectivity is equal to or larger than 5. Further, it is found out from the result of FIG. 6B that the ratio of the H to the sum of the H, F and C needs to be in a range B from 0.02 to 0.06 (2% to 6%) to meet the condition that the etching rate of the stacked film ON is equal to or larger than 50 nm/min and the etching rate of the base film 100 is less than 20 nm/min. As can be seen from these results, it is desirable that the ratio of the H to the sum of the H, F and C is in the range from 0.02 to 0.06 (2% to 6%) to satisfy the requirements for both the selectivity and the etching rate.

A horizontal axis in each of FIG. 6C and FIG. 6D indicates a ratio of the F to the sum of the H, F and C included in the gases; a vertical axis of FIG. 6C represents the selectivity of the stacked film 101 against the base film 100; and a vertical axis of FIG. 6D represents the etching rates of the stacked film 101 and the base film 100.

It is desirable that the ratio of the F to the sum of the H, F and C is set to allow the selectivity to be equal to or larger than 5 indicated by a dashed line in FIG. 6C and the etching rate of the stacked film ON to be equal to or larger than 50 nm/min indicated by a dashed line in FIG. 6D. Further, in FIG. 6D, it is desirable that the etching rate of the base film 100 is less than 20 nm/min. It is found out from the result of FIG. 6C that the ratio of the F to the sum of the H, F and C needs to be in a range C from 0.63 to 0.66 (63% to 66%) to meet the condition that the selectivity is equal to or larger than 5. Further, it is found out from the result of FIG. 6D that the ratio of the F to the sum of the H, F and C needs to be in a range D from 0.63 to 0.65 (63% to 65%) to meet the condition that the etching rate of the stacked film ON is equal to or larger than 50 nm/min whereas the etching rate of the base film 100 is less than 20 nm/min. As can be seen from these results, it is desirable that the ratio of the F to the sum of the H, F and C is in the range from 0.63 to 0.65 (63% to 65%) to satisfy the requirements for both the selectivity and the etching rate.

As stated above, it is desirable to use the gases in which the ratio of the H to the sum of the H, F and C is in the range from 0.02 to 0.06 (2% to 6%) since the required selectivity of the stacked film 101 against the base film 100 and the required etching rate of the stacked film 101 can be achieved. Further, the gases used in the etching method according to the present exemplary embodiment are not merely limited to the $CH_2F_2$ gas, the $C_4F_8$ gas, and the $O_2$ gas as long as the ratio of the H to the sum of the H, F and C in the gases is in the range from 0.02 to 0.06 (2% to 6%).

Further, it is desirable to use the gases in which the ratio of the F to the sum of the H, F and C is in the range from 0.63 to 0.65 (63% to 65%) since the required selectivity of the stacked film 101 against the base film 100 and the required etching rate of the stacked film 101 can be achieved. Further, the gases used in the etching method according to the present exemplary embodiment are not merely limited to the $CH_2F_2$ gas, the $C_4F_8$ gas, and the $O_2$ gas as long as the ratio of the F to the sum of the H, F and C in the gas is in the range from 0.63 to 0.65 (63% to 65%).

Further, if gases in which the ratio of the H to the sum of the H, F and C is in the range from 0.02 to 0.06 (2% to 6%) and the ratio of the F to the sum of the H, F and C is in the range from 0.63 to 0.65 (63% to 65%) are used, better selectivity with respect to the base film 100 and a better etching rate for the stacked film 101 can be achieved.

An example of the gases that satisfy the above-specified conditions and thus can be used in the etching method according to the present exemplary embodiment may include at least one of a fluorocarbon gas (CF-based gas) or a hydrofluorocarbon gas (CHF-based gas), and at least one of a hydrofluorocarbon gas (CHF-based gas), a hydrocarbon gas (CH-based gas) or a hydrogen-containing gas. The hydrogen-containing gas may be a hydrogen gas ($H_2$) or hydrogen halide.

An example of the hydrofluorocarbon gas (CHF-based gas) may be a $CH_2F_2$ gas, a $CHF_3$ gas, a $C_3H_2F_4$ gas, or the like. An example of the fluorocarbon gas (CF-based gas) may be a $C_4F_8$ gas, a $C_4F_6$ gas, a $CF_4$ gas, or the like. An example of the hydrocarbon gas (CH-based gas) may be a $CH_4$ gas, a $C_2H_6$ gas, a $C_2H_4$ gas, or the like. An example of the hydrogen halide may be HBr, HCl, HF, HI, or the like.

Now, mechanism of the low-temperature etching in the over-etching process according to the present exemplary embodiment will be described with reference to FIG. 7.

Figure 7:
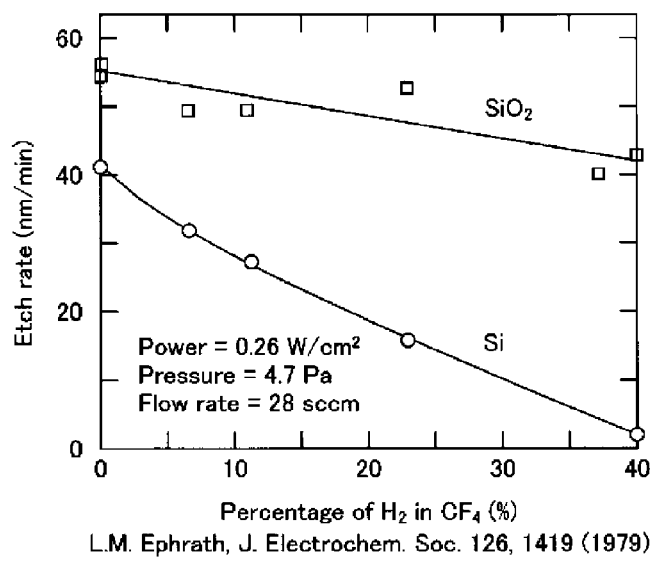
FIG. 7 is a diagram illustrating a relationship between a ratio of H in a gas and an etching rate in an environment other than a low-temperature environment.

FIG. 7 presents a graph illustrating a relationship between an etching rate and a ratio of H in a gas in a high-temperature (room-temperature) environment. The graph of FIG. 7 is quoted from 'L. M. Ephrath, J. Electrochem. Soc. 126, 1419(1979).' FIG. 7 shows etching rates of a silicon film (Si) and a silicon oxide film ($SiO_2$), and a percentage of $H_2$ in the supplied gases when an etching is performed by plasma formed from a $CF_4$ gas and a $H_2$ gas.

As can be seen from FIG. 7, in the high-temperature (room-temperature) environment, the etching rate of the silicon film (Si) decreases with an increase of the percentage of the $H_2$ with respect to the $CF_4$ gas. When the ratio of the $H_2$ is set to be about 40%, the etching rate of the silicon film (Si) becomes almost zero (0).

If the $H_2$ gas is added to plasma of the $CF_4$ gas, H radicals in the plasma formed from the mixed gas of $H_2$ and $CF_4$ react with F radicals or CF radicals, so that hydrogen fluoride (HF) is generated. As F is consumed through this reaction, a polymerized film with a low percentage of F to C, that is, a carbon-rich deposit film is formed on a surface of the silicon film (Si). It is assumed that this deposit film becomes a hindrance factor, so that the etching rate of the Si (silicon film) decreases.

Meanwhile, in the high-temperature (room-temperature) environment, even if the percentage of the $H_2$ gas to the $CF_4$ gas is increased, the etching rate of the $SiO_2$ (silicon oxide film) is just slightly reduced. It is deemed to be because a deposit film deposited on a surface of the silicon oxide film ($SiO_2$) is removed by being turned into a CO gas, a $CO_2$ gas or a $COF_2$ gas as oxygen (O) is supplied from the silicon oxide film ($SiO_2$) with a progress of an etching reaction of the silicon oxide film ($SiO_2$), without ending up as a factor that reduces the etching rate of the $SiO_2$ (silicon oxide film). As can be seen from the foregoing, when the etching is performed under a condition that the substrate temperature is higher than 15° C., the selectivity of the silicon oxide film with respect to the silicon ($SiO_2$/Si selectivity) can be increased by setting a partial pressure of the hydrogen in the gases to be high.

However, in comparison with the tendency of the etching rate of the base film 100 and the etching rate of the stacked film 101 including the silicon oxide film in the etching method according to the exemplary embodiment shown in FIG. 5A, FIG. 5B and FIG. 6B, the etching rate of the base film 100 and the etching rate of the stacked film 101 are both found out to increase if the ratio of the $CH_2F_2$ gas including H (see FIG. 5A and FIG. 5B) or the ratio of the hydrogen (H) (see FIG. 6B) is increased. This tendency does not coincide with the tendency of FIG. 7.

Figure 8A:
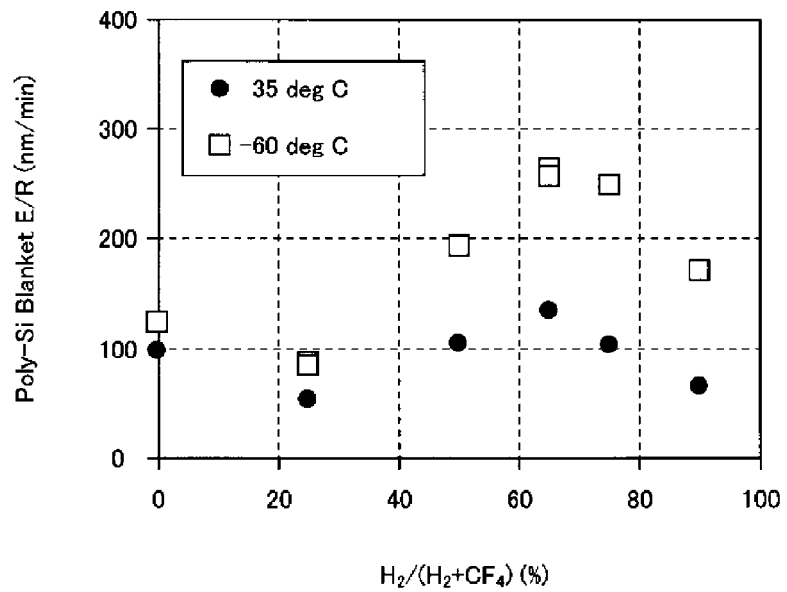
FIG. 8A and FIG. 8B are diagrams illustrating an example of a relationship between a ratio of H in the gas used in the etching method according to the exemplary embodiment and the etching rate.
Figure 8B:
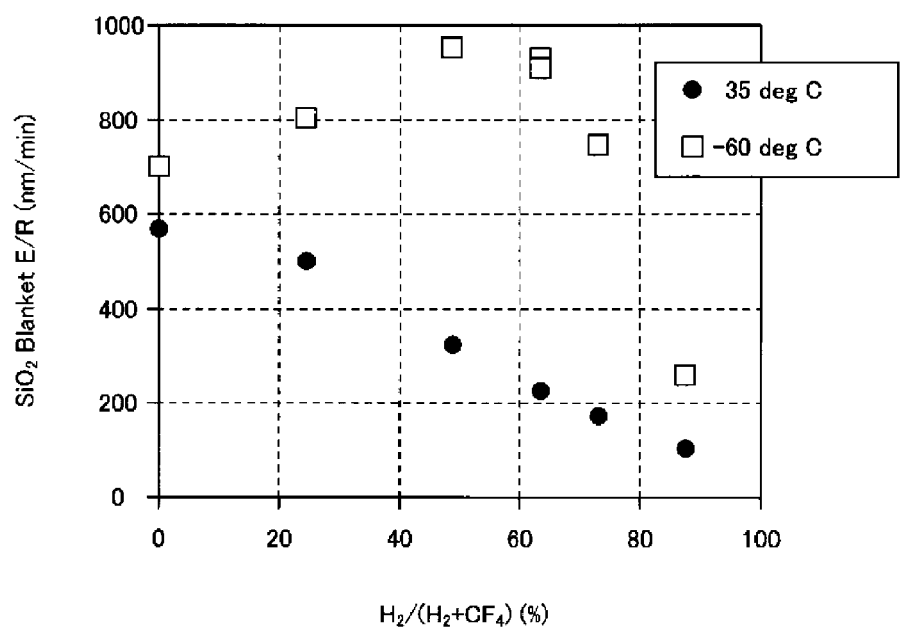

FIG. 8A and FIG. 8B are diagrams illustrating an example of a relationship between a ratio of H in a gas used in the etching method according to the exemplary embodiment and an etching rate of a blanket film (a flat film without a mask or the like) of polysilicon (Poly-Si). A horizontal axis of FIG. 8A represents a ratio of hydrogen ($H_2$) in a mixed gas of $H_2$ and $CF_4$, and a vertical axis thereof indicates an etching rate of the polysilicon film (Poly-Si). A horizontal axis of FIG. 8B represents a ratio of hydrogen ($H_2$) in the mixed gas of $H_2$ and $CF_4$, and a vertical axis thereof represents an etching rate of a silicon oxide film ($SiO_2$). A rectangular (white-colored) mark indicates an etching rate when the low-temperature etching is performed at the substrate temperature of −60° C., and a circular (black-colored) mark indicates an etching rate when the etching is performed at the substrate temperature of 35° C. In comparison with FIG. 7, a zone with a high ratio of the $H_2$ gas is also observed, and the etching rates are observed in two zones: under the high-temperature (room temperature) condition and under the low-temperature condition.

In the experimental result of FIG. 8A, in a zone where the ratio of H in the mixed gas is equal to or less than 30%, the etching rate of the polysilicon film (Poly-Si) shows the same tendency as shown in FIG. 7. In a zone where the ratio of H in the mixed gas is equal to or larger than 40%, however, the etching rate of the polysilicon film (Poly-Si) increases. This is deemed to be because the deposit film on the surface of the polysilicon film (Poly-Si) is thinned as a ratio of the $CF_4$ gas in the mixed gas is reduced and a supply of carbon (C) itself is reduced. Further, since the $CF_4$ gas is a gas having a high content of F atoms, the F atoms serving as etchants for the polysilicon film (Poly-Si) may still exist in a large quantity even if the supply of the carbon (C) is reduced due to the reduction of the ratio of the $CF_4$ gas. Thus, it is believed that the etching of the polysilicon film (Poly-Si) is accelerated.

Further, although the etching rate of the polysilicon film (Poly-Si) with respect to the ratio of the H in the mixed gas shows the same tendency in the high-temperature (room-temperature) environment and the low-temperature environment, the etching rate of the polysilicon film (Poly-Si) in the low-temperature environment is higher than the etching rate of the polysilicon film (Poly-Si) in the high-temperature (room-temperature) environment. This is deemed to be because an adsorption coefficient of HF is increased due to the low temperature, causing the HF to be adsorbed into the surface of the polysilicon film (Poly-Si). Further, although the HF itself has low thermal energy reactivity to the polysilicon film, it is deemed that the polysilicon film reacts with F atoms in the HF as energy by ion radiation is applied from plasma in the state that the HF is attached to the polysilicon film, resulting in acceleration of the etching of the polysilicon.

Further, in a zone where the ratio of the H in the mixed gas is equal to or larger than 70%, it is deemed that the etching rate of the polysilicon film (Poly-Si) is reduced because a supply amount of F atoms decreases as well.

In the experimental result of FIG. 8B, the etching rate of the silicon oxide film ($SiO_2$) decreases with an increase of the ratio of the H in the mixed gas in the high-temperature (room-temperature) environment, which exhibits the same tendency shown in FIG. 7. Further, in the zone where the ratio of the H in the mixed gas is equal to or larger than 40% as well, the etching rate of the silicon oxide film ($SiO_2$) tends to decrease. In contrast, in a zone under the low-temperature environment, particularly, in a zone where the ratio of the H in the mixed gas is equal to or less than 70%, the etching rate of the silicon oxide film ($SiO_2$) tends to increase as the ratio of the H in the mixed gas increases, which is different from the tendency shown in FIG. 7. Further, the etching rate of the silicon oxide film ($SiO_2$) in the low-temperature environment is higher than the etching rate of the silicon oxide film ($SiO_2$) in the high-temperature (room-temperature) environment.

In the low-temperature environment, the same as in the case of the polysilicon film, the adsorption coefficient of HF increases due to the low temperature, and HF is adsorbed on the surface of the silicon oxide film. Further, during an etching reaction of the silicon oxide film by the plasma formed from the $CF_4$ gas, $SiF_4$ and water ($H_2O$) are generated as reaction products. Since, however, a saturated vapor pressure of the water is low, it is deemed that, under the low-temperature environment, the water is saturated on the surface of the silicon oxide film to exist thereon in a liquid phase to some extent. Further, water and HF react, producing hydrofluoric acid, which is deemed to accelerate the etching through, mainly, a chemical reaction by the hydrofluoric acid dissolved in the water on the surface of the silicon oxide film, the etching rate is singularly increased.

As can be seen from the foregoing, by supplying the gases while maintaining the appropriate ratio of the H in the mixed gas (ranging from about 30% to about 50%) in the low-temperature environment, it is possible to maintain the etching rate of the silicon oxide film high while maintaining the etching rate of the polysilicon film low. Accordingly, the selectivity for the silicon oxide film with respect to the polysilicon film can be achieved.

That is, to achieve the selectivity for the etching target film (here, the silicon oxide film) with respect to the silicon film (here, the polysilicon film) by maintaining the etching rate of the etching target film high while maintaining the etching rate of the silicon film low, it is important to supply the hydrogen (H), the fluorine (F) and the carbon (C) in an appropriate balance (here, the ratio of the H in the mixed gas) in the low-temperature environment.

Figure 9:
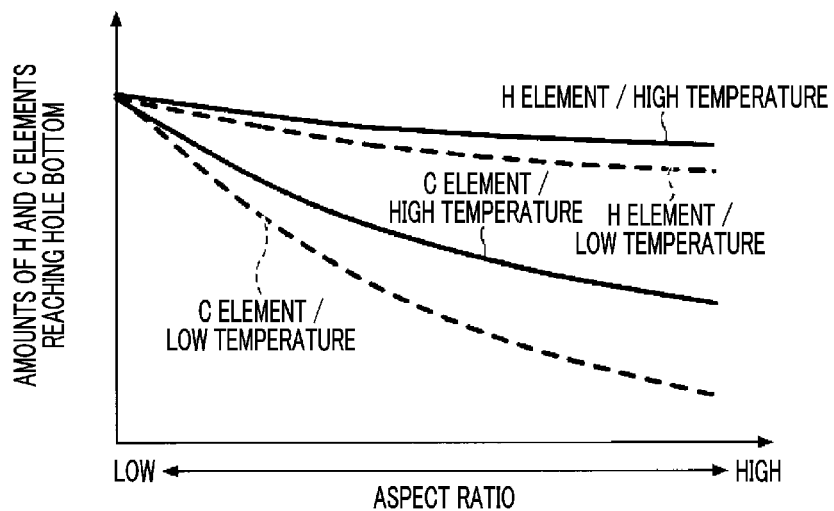
FIG. 9 is a diagram illustrating an example of a relationship between a substrate temperature and amounts of C and H arriving at a hole bottom.

FIG. 9 is a diagram illustrating an example of a relationship between a substrate temperature and amounts of carbon (C) and hydrogen (H) arriving at a bottom of a hole. In FIG. 9, a low temperature implies that the substrate temperature is equal to or less than 15° C., and a high temperature implies that the substrate temperature is higher than 15° C. A horizontal axis of FIG. 9 represents an aspect ratio (AR), which increases as it goes to the right. A vertical axis of FIG. 9 represents an amount of C arriving at the bottom of the hole. In the etching method according to the present exemplary embodiment, it is assumed that low-temperature etching is performed to form a recess such as a hole having an aspect ratio equal to or larger than 40.

Assume that a gas including C, H and F such as a $CH_2F_2$ gas or a mixed gas of $H_2$ and $CF_4$ is used in the etching. Since C and $C_xF_y$ have higher adsorption coefficient than H, C is physically adsorbed into a relatively shallow sidewall of the hole to be trapped therein. Accordingly, the amount of C reaching the bottom of the hole decreases. As a result, at the bottom of the hole h, ratios of H and F are relatively higher than the ratio of C, as compared to the relatively shallow portion of the hole. Further, as compared to the high-temperature etching, although both C and H decrease in the amounts arriving at the bottom of the hole in the low-temperature etching, C has a larger decrement than H, as shown in FIG. 9.

Thus, in the low-temperature etching, the ratios of H and F with respect to C reaching the bottom of the hole increase in case of etching the hole having the aspect ratio equal to or larger than 40. That is, in the low-temperature etching of the hole having the aspect ratio equal to or larger than 40, the ratios of H and F with respect to C at the bottom of the hole is expected to be higher than the ratios of H and F with respect to C at a bottom of a hole having a low aspect ratio.

In consideration of the experimental results of FIG. 5A, FIG. 5B and FIG. 6B on this ground, it is conjectured that the low-temperature environment may be set and the ratio of H in the mixed gas may be in the range from 30% to 50% in the experimental results of FIG. 8A and FIG. 8B. That is, it is important to supply hydrogen (H), fluorine (F) and carbon (C) in an appropriate balance in the low-temperature environment, depending on the aspect ratio.

Accordingly, it is possible to obtain high etching rates in the main etching and the over-etching which are performed by the low-temperature etching, and it is also possible to obtain sufficient selectivity in the over-etching. Further, by setting the condition of the substrate temperature to be same in the main etching and the over-etching, the control time for the substrate temperature is not required between in the main etching and in the over-etching, leading to the improvement of the throughput. Further, it becomes also possible to perform the main etching and the over-etching in the same plasma processing apparatus consecutively.

Modification Example: Improvement of Bottom CD

In the above-described etching method, if the aspect ratio increases to equal to or higher than 40, a leading end of the recess formed in the stacked film 101 is narrowed, and a CD of a bottom (hereinafter, referred to as bottom CD (Btm CD)) of the recess is reduced. In a modification example of the etching method according to the present exemplary embodiment, however, to keep the recess vertical by enlarging the bottom CD, a $SiCl_4$ gas is added to a $CH_2F_2$ gas, a $C_4F_8$ gas and an $O_2$ gas.

Figure 10:
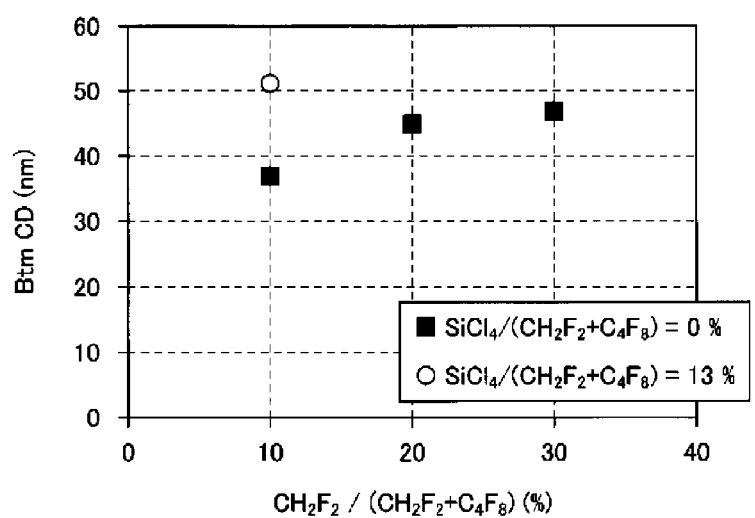
FIG. 10 is a diagram illustrating an example of a bottom CD when a $SiCl_4$ gas is added to the gas used in the etching method according to the exemplary embodiment.

FIG. 10 is a diagram illustrating examples of a bottom CD when a $SiCl_4$ gas is added to a $CH_2F_2$ gas, a $C_4F_8$ gas and an $O_2$ gas in the etching method according to the exemplary embodiment. Processing conditions other than the gases in over-etching according to the modification example are the same as those specified in <Processing conditions for over-etching of present exemplary embodiment>. In the experimental result shown in FIG. 10, in case that the $SiCl_4$ is added (indicated by a white circular mark), the bottom CD can be enlarged by equal to or larger than 25%, as compared to a case where the $SiCl_4$ is not added (indicated by a black square marks). Thus, the leading end of the recess is given a rectangular shape. Further, when the $SiCl_4$ gas is added, the amount of the $SiCl_4$ gas is set to be 13% of the sum of the $CH_2F_2$ gas and the $C_4F_8$ gas.

FIG. 11 is a diagram illustrating examples of a bottom CD when a $SiCl_4$ gas and others are added to a $CH_2F_2$ gas, a $C_4F_8$ gas and an $O_2$ gas in the etching method according to the exemplary embodiment. Processing conditions other than the gases in over-etching according to the modification example are the same as those specified in <Processing conditions for over-etching of present exemplary embodiment>. In the experimental result shown in FIG. 11, when none of a $SiCl_4$ gas, a $Cl_2$ gas or a HBr gas is added to the $CH_2F_2$ gas, the $C_4F_8$ gas and the $O_2$ gas, Bow CD indicating a CD of the most protruding portion of the recess is found to be 90; Btm CD, 39; and a difference therebetween, 51.

Meanwhile, when the $SiCl_4$ gas is added to the $CH_2F_2$ gas, the $C_4F_8$ gas and the $O_2$ gas, Bow CD is found to be 91; Btm CD, 51; and a difference therebetween, 40. Further, when the $Cl_2$ gas is added, Bow CD is found to be 90; Btm CD, 52; and a difference therebetween, 38. Furthermore, when the HBr gas is added, Bow CD is found to be 92; Btm CD, 53; and a difference therebetween, 39. If any of the $SiCl_4$ gas, the $Cl_2$ gas and the HBr gas is added, the difference between the Bow CD and the Btm CD is reduced, as compared to the case where none of them is added. Thus, the Btm CD is improved, and the leading end of the recess is given the rectangular shape.

Further, a ratio of the $CH_2F_2$ gas to the sum of the $CH_2F_2$ gas and the $C_4F_8$ gas is 12.5% when the $SiCl_4$ gas, the $Cl_2$ gas or the HBr gas is not added to the $CH_2F_2$ gas, the $C_4F_8$ gas and the $O_2$ gas, when the $SiCl_4$ gas is used as the additive gas, and when the $Cl_2$ gas is used as the additive gas. Further, when the $SiCl_4$ gas is used as the additive gas and when the $Cl_2$ gas is used as the additive gas, 13% of $SiCl_4$ gas or $Cl_2$ gas with respect to the sum of the $CH_2F_2$ gas and the $C_4F_8$ gas is added.

Furthermore, when using the HBr gas as the additive gas, a ratio of the $CH_2F_2$ gas to the sum of the $CH_2F_2$ gas and the $C_4F_8$ gas is 0%, and a ratio of the HBr gas to the sum of the $CH_2F_2$ gas and the $C_4F_8$ gas is 14.3. If the HBr gas is used as the additive gas, it contains hydrogen. Thus, even if $CH_2F_2$ gas is not included in the over-etching, the etching of the stacked film 101 is enabled.

As can be seen from the foregoing, it is desirable that the gases used in the etching method further include a halogen-containing gas other than fluorine, such as $SiCl_4$ gas, $Cl_2$ gas or a HBr gas, in addition to the $CH_2F_2$ gas, the $C_4F_8$ gas, and the $O_2$ gas. By using these gases, it is possible to enlarge the Btm CD without enlarging the Bow CD, so that the leading end of the recess can be given the rectangular shape.

Further, the halogen-containing gas other than the fluorine may be a HCl gas, a HI gas, a $Br_2$ gas, a $CF_2Br_2$ gas or the like in addition to the $SiCl_4$ gas, the $Cl_2$ gas and the HBr gas.

As described above, according to the etching method and the plasma processing apparatus of the present exemplary embodiment, it is possible to achieve the selectivity while maintaining the etching rate in the over-etching for exposing the underlying film of the stacked film including the silicon oxide films and the silicon nitride films in the low-temperature environment.

It should be noted that the etching method and the plasma processing apparatus according to the above-described exemplary embodiments are illustrative in all aspects and are not anyway limiting. The above-described exemplary embodiments can be modified and improved in various ways without departing from the scope and the spirit of claims. Unless contradictory, other configurations may be adopted, and the disclosures in the various exemplary embodiments can be combined appropriately.

The plasma processing apparatus of the present disclosure may be applicable to any of various types of apparatuses such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

According to the exemplary embodiment, it is possible to achieve the selectivity against the base film while maintaining, in etching the stacked film including the silicon oxide film and the silicon nitride film in the low-temperature environment to expose the base film, the appropriate etching rate of the stacked film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An etching method of forming, on a substrate having a base film; a stacked film in which a first film and a second film are alternately stacked on the base film; and a mask on the stacked film, a recess in the stacked film through the mask by using plasma, the etching method comprising:
   preparing the substrate; and
   etching the stacked film until the recess of the stacked film reaches the base film by plasma formed from a gas containing hydrogen, fluorine and carbon, while maintaining a substrate temperature equal to or less than 15° C.,
   wherein a ratio of the hydrogen to a sum of the hydrogen, the fluorine and the carbon included in the gas is in a range from 0.02 to 0.06.

2. The etching method of claim 1,
   wherein the gas includes at least one of a fluorocarbon gas (CF-based gas) or a hydrofluorocarbon gas (CHF-based gas), and at least one of a hydrofluorocarbon bas (CHF-based gas), hydrocarbon gas (CH-based gas) or a hydrogen-containing gas, and
   the hydrogen-containing gas is a hydrogen gas or hydrogen halide.

3. The etching method of claim 1, further comprising:
   etching the stacked film until the recess of the stacked film reaches a preset depth before the etching of the stacked film until the recess of the stacked film reaches the base film.

4. The etching method of claim 3,
   wherein the preset depth of the recess is equal to or larger than 40 in aspect ratio.

5. The etching method of claim 3,
   wherein a substrate temperature in the etching of the stacked film until the recess of the stacked film reaches a preset depth is equal to the substrate temperature in the etching of the stacked film until the recess of the stacked film reaches the base film.

6. The etching method of claim 1,
   wherein the gas further includes a halogen-containing gas other than fluorine.

7. The etching method of claim 6,
wherein the halogen-containing gas other than fluorine is at least one of a $SiCl_4$ gas, $Cl_2$ gas, a HBr gas, a HCl gas, a HI gas, a $Br_2$ gas, or a $CF_2Br_2$ gas.

8. The etching method of claim 1,
wherein the first film is a silicon oxide film, and the second film is a silicon nitride film.

9. The etching method of claim 1,
wherein the base film is one of polysilicon, amorphous silicon, and single crystal silicon.

10. The etching method of claim 1,
wherein the mask is made of an organic material.

11. The etching method of claim 1,
wherein
a ratio of the fluorine to a sum of the hydrogen, the fluorine and the carbon included in the gas is in a range from 0.63 to 065.

12. The etching method of claim 1,
wherein the gas includes a first gas and a second gas different from the first gas,
the first gas includes at least one of a fluorocarbon gas (CF-based gas) or a hydrofluorocarbon gas (CHF-based gas), and
the second gas includes at least one of a hydrofluorocarbon bas (CHF-based gas), hydrocarbon gas (CH-based gas) or a hydrogen-containing gas.

13. The etching method of claim 12,
wherein the hydrogen-containing gas is a hydrogen gas or hydrogen halide.

14. The etching method of claim 12,
wherein the hydrofluorocarbon gas included in the first gas and the second gas is at least one of a $CH_2F_2$ gas, a $CHF_3$ gas, or a $C_3H_2F_4$ gas.

15. The etching method of claim 12,
wherein the fluorocarbon gas included in the first gas is at least one of a $C_4F_8$ gas, a $C_4F_6$ gas, or a $CF_4$ gas.

16. The etching method of claim 12,
wherein the hydrocarbon gas included in the second gas is at least one of a $CH_4$ gas, a $C_2H_6$ gas, or a $C_2H_4$ gas.

17. The etching method of claim 1,
wherein the gas further includes an oxygen-containing gas.

18. The etching method of claim 1,
wherein the etching the stacked film comprises:
a main etching of etching the stacked film until the recess of the stacked film reaches a preset depth; and
after the main etching, an over etching of etching the stacked film until the recess of the stacked film reaches the base film.

19. The etching method of claim 18,
wherein the main etching and the over etching are performed in a same plasma processing apparatus consecutively.

20. An etching method of forming, on a substrate having a base film; a stacked film in which a first film and a second film are alternately stacked on the base film; and a mask on the stacked film, a recess in the stacked film through the mask by using plasma, the etching method comprising:
preparing the substrate; and
etching the stacked film until the recess of the stacked film reaches the base film by plasma formed from a gas containing hydrogen, fluorine and carbon, while maintaining a substrate temperature equal to or less than 15° C.,
wherein a ratio of the fluorine to a sum of the hydrogen, the fluorine and the carbon included in the gas is in a range from 0.63 to 065.

* * * * *